(12) United States Patent
Shinohara et al.

(10) Patent No.: US 9,347,970 B2
(45) Date of Patent: May 24, 2016

(54) PROBE APPARATUS

(75) Inventors: Eiichi Shinohara, Yamanashi (JP); Ken Taoka, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 142 days.

(21) Appl. No.: 14/346,381

(22) PCT Filed: Jul. 30, 2012

(86) PCT No.: PCT/JP2012/069923
§ 371 (c)(1),
(2), (4) Date: Mar. 21, 2014

(87) PCT Pub. No.: WO2013/042467
PCT Pub. Date: Mar. 28, 2013

(65) Prior Publication Data
US 2014/0247037 A1    Sep. 4, 2014

(30) Foreign Application Priority Data

Sep. 22, 2011    (JP) .................. 2011-225335

(51) Int. Cl.
*G01R 1/04* (2006.01)
*G01R 1/067* (2006.01)
*G01R 31/28* (2006.01)
(52) U.S. Cl.
CPC .............. *G01R 1/0491* (2013.01); *G01R 1/067* (2013.01); *G01R 31/2887* (2013.01); *G01R 31/2891* (2013.01)
(58) Field of Classification Search
CPC ................ G01R 1/067; G01R 31/26

USPC ............................. 324/750.25, 149
See application file for complete search history.

(56) References Cited

U.S. PATENT DOCUMENTS 5,473,254 A * 12/1995 Asar ................... G01R 31/043
324/537
6,529,011 B1   3/2003 Okubo
2006/0145716 A1   7/2006 Komatsu
(Continued)

FOREIGN PATENT DOCUMENTS

JP    05-333098 A    12/1993
JP    2011-007743 A    1/2011
(Continued)

OTHER PUBLICATIONS

International Search Report for PCT/JP2012/069923 dated Aug. 28, 2012.

*Primary Examiner* — Tung X Nguyen
*Assistant Examiner* — Zannatul Ferdous
(74) *Attorney, Agent, or Firm* — Pearne & Gordon LLP

(57) ABSTRACT

A probe apparatus 10 has a movable mounting table 12 that mounts a wafer W on which multiple power devices are formed; a probe card 14 that is provided above the mounting table 12 and has multiple probes 14A; a conductive film electrode 13 formed on a mounting surface of the mounting table 12 and an outer peripheral surface thereof; and a measurement line 16 that electrically connects the conductive film electrode 13 to a tester 17. Further, the probe apparatus measures electrical characteristics of the power devices on the mounting table 12 at a wafer level. Furthermore, the measurement line 16 includes a switch device 18 configured to open and close an electric path of the measurement line 16 between the conductive film electrode 13 and the tester 17.

4 Claims, 4 Drawing Sheets

(56) References Cited

U.S. PATENT DOCUMENTS

| | | | |
|---|---|---|---|
| 2009/0058446 A1* | 3/2009 | Yamamoto | G01R 31/2891 324/750.28 |
| 2009/0315580 A1* | 12/2009 | Yamada | G01R 31/2891 324/756.03 |
| 2010/0033199 A1 | 2/2010 | Komatsu | |
| 2010/0327898 A1 | 12/2010 | Ishigaki et al. | |
| 2013/0063171 A1* | 3/2013 | Kouno | G01R 31/2886 324/750.25 |

FOREIGN PATENT DOCUMENTS

| | | |
|---|---|---|
| JP | 2012-058225 A | 3/2012 |
| WO | 2011/111834 A1 | 9/2011 |

\* cited by examiner

PROBE APPARATUS

CROSS-REFERENCE TO RELATED APPLICATION

This Application is a U.S. national phase application under 35 U.S.C. §371 of PCT Application No. PCT/JP2012/069923 filed on Jul. 30, 2012, which claims the benefit of Japanese Patent Application No. 2011-225335 filed on Sep. 22, 2011, the entire disclosures of which are incorporated herein by reference.

TECHNICAL FIELD

The embodiments described herein pertain generally to a probe apparatus configured to measure electrical characteristics (static characteristics and dynamic characteristics) of a power device.

BACKGROUND

A power device has been widely used as a component for various kinds of power supplies or for electric devices of motor vehicles, or as a component for electric devices of industrial machines. As compared with a typical semiconductor device, the power device has a high breakdown voltage and a high current, and also has a high speed and a high frequency depending on an application thereof. Examples of the power device include an IGBT, a diode, a power transistor, a power MOS-FET, a thyristor, and the like. When these power devices are selected as high quality products through measurement of electrical characteristics (static characteristics and dynamic characteristics) thereof, they come into the market depending on applications thereof.

A probe apparatus has been widely used as a testing apparatus configured to measure electrical characteristics of a semiconductor device such as a memory device or the like while a power device is not separated from a wafer. The probe apparatus typically includes a loader chamber and a prober chamber adjacent thereto. While a wafer is transferred into the loader chamber, pre-alignment is carried out, and after electrical characteristics of the wafer loaded from the loader chamber are measured in the prober chamber, the measured wafer is returned back to the loader chamber. Recently, various technologies for applying such a probe apparatus to measurement of electrical characteristics of a power device have been developed, and a probe apparatus that measures static characteristics, such as resistance or the like, of a power device has been developed and commercialized.

FIG. 4 is a conceptual diagram showing an example of a conventional probe apparatus. FIG. 4 illustrates a prober chamber of a probe apparatus configured to measure static characteristics of a power device at a wafer level.

As depicted in FIG. 4, the prober chamber includes a movable mounting table 1 configured to mount a wafer W thereon, and a probe card 2 provided above the mounting table 1. On a surface of the mounting table 1, a conductive film electrode 3 (shown as a thick line in FIG. 4) made of a conductive metal such as gold or the like is formed. This conductive film electrode 3 is electrically connected to a tester 5 via a measurement line 4 (for example, cable).

If the probe apparatus depicted in FIG. 4 measures static characteristics of a power device at a wafer level, when the wafer W is mounted on the mounting table 1, a collector electrode of the power device on a lower surface of the wafer W is brought into electrical contact with the conductive film electrode 3 of the mounting table 1. When the probe card 2 is brought into contact with this wafer W, a gate electrode and an emitter electrode of the power device are electrically connected to multiple probes 2A. In this state, if a voltage is applied from the probe 2A to the gate electrode of the power device, a high current flows from the tester 5 to the measurement line 4, the conductive film electrode 3, the collector electrode, and the emitter electrode. In this case, static characteristics, such as resistance or the like, of the power device are measured via other probes 2A. Further, in FIG. 4, the probe card 2 is fixed to a head plate 6 via a clamp device (not illustrated).

As described above, a probe apparatus that measures static characteristics of a power device has been commercialized. However, a probe apparatus configured to measure dynamic characteristics of a power device is still under development and does not reach a level of commercialization. For this reason, dynamic characteristics of a power device need to be measured during a packaging process, and if a package product is evaluated as a defective product, it is wasted. Therefore, production yield of a power device as a product is deteriorated, so that defective products are likely to be produced.

Further, the present applicant developed a probe apparatus capable of measuring dynamic characteristics of a power device based on the probe apparatus depicted in FIG. 4 (see Patent Document 1). That is, in the probe apparatus described in Patent Document 1, the same measurement line as the measurement line 4 depicted in FIG. 4 is provided at the mounting table of the probe apparatus, so that both of static characteristics and dynamic characteristics of the power device can be measured with a single probe apparatus.

REFERENCES

Patent Document 1: Japanese Patent Laid-open Publication No. 2012-058225

DISCLOSURE OF THE INVENTION

Problems to be Solved by the Invention

However, in the probe apparatus depicted in FIG. 4, the conductive film electrode 3 of the mounting table 1 is continuously connected to the tester 5 through the measurement line 4. Therefore, in the probe apparatus described in Patent Document 1 in which the same measurement line as the measurement line 4 is provided, it has been found that when dynamic characteristics, such as a switching characteristic, of a power device are measured, inductance of the measurement line 4 serves as an obstacle, so that the dynamic characteristics cannot be measured with high accuracy.

In view of the foregoing problems, example embodiments provide a probe apparatus capable of measuring both of static characteristics and dynamic characteristics of a power device at a wafer level, and particularly capable of surely measuring dynamic characteristics of a power device at a wafer level without being affected by a measurement line that measures static characteristics.

Means for Solving the Problems

In order to solve the above-mentioned problems, in a first example embodiment, a probe apparatus has a movable mounting table that mounts a target object on which multiple power devices are formed; a probe card that is provided above the mounting table and has multiple probes; a conductive film electrode formed on at least a mounting surface of the mounting table; a first measurement line that electrically connects the conductive film electrode to a tester via the probe card and measures dynamic characteristics of the power devices; and a second measurement line that electrically connects the conductive film electrode to the tester and measures static characteristics of the power devices. Further, the probe apparatus is configured to measure the static characteristics or the dynamic characteristics of the power devices by electrically connecting the multiple probes with multiple electrodes of each of the power devices of the target object mounted on the mounting table. Here, the second measurement line includes a switch device configured to open and close the second measurement line between the conductive film electrode and the tester.

In the first example embodiment, the switch device may include a relay switch device.

In the first example embodiment, the switch device may include a solenoid device and a contactor configured to be electrically attached and detached to and from the conductive film electrode via the solenoid device.

In the first example embodiment, the first measurement line may include a conductor provided between the conductive film electrode and the probe card.

Effect of the Invention

In accordance with example embodiments, a probe apparatus can measure both of static characteristics and dynamic characteristics of a power device at a wafer level, and particularly can surely measure dynamic characteristics of a power device at a wafer level without being affected by a measurement line that measures static characteristics.

MODE FOR CARRYING OUT THE INVENTION

Hereinafter, a probe apparatus in accordance with an example embodiment will be explained with reference to FIG. 1 to FIG. 3.

Figure 1:
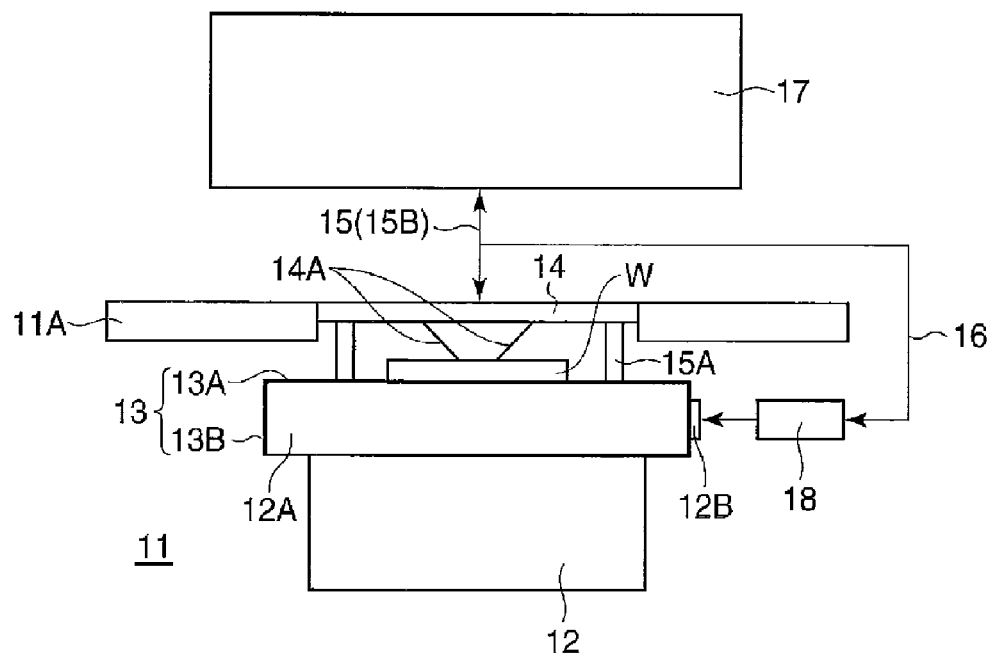
FIG. 1 is a conceptual diagram showing a probe apparatus in accordance with an example embodiment.

FIG. 1 is a conceptual diagram showing a probe apparatus in accordance with an example embodiment.

A probe apparatus 10 in accordance with the present example embodiment is configured to receive a wafer W in a prober chamber 11 from a loader chamber (not illustrated) that transfers the wafer W, and to measure electrical characteristics (static characteristics and dynamic characteristics) of multiple power devices formed on the wafer W within the prober chamber 11, as depicted in, for example, FIG. 1.

As depicted in FIG. 1, within the prober chamber 11, a mounting table 12 configured to mount the wafer W thereon is provided to be movable in directions of X, Y, Z, and θ. Further, on the entire surface of a mounting surface of a chuck top 12A of the mounting table 12 and the entire surface of a circumferential surface thereof, a conductive film electrode 13 (shown as a thick line in FIG. 1) made of a conductive metal such as gold or the like is formed as a collector electrode. The chuck top 12A includes a vacuum-attraction unit configured to vacuum-attract the wafer W on the mounting surface of the chuck top 12A. Further, the mounting table 12 accommodates a temperature control unit therein, and is configured to heat or cool the wafer W to be a preset temperature and configured to measure electrical characteristics (static characteristics and dynamic characteristics) of the power devices. The conductive film electrode 13 includes a first conductive film electrode member 13A formed on the entire surface of the mounting surface of the chuck top 12A and a second conductive film electrode member 13B formed on the entire surface of an outer peripheral surface of the chuck top 12A.

Above the mounting table 12, as depicted in FIG. 1, a probe card 14 provided with a card holder is fixed to a head plate 11A, which forms an upper surface of the prober chamber 11, via a clamp mechanism (not illustrated). At a central portion on a lower surface of the probe card 14, multiple probes 14A are provided. These probes 14A are configured to be electrically connected to a gate electrode and an emitter electrode of each of the power devices formed on the wafer W and measure electrical characteristics of the power devices.

Further, the probe apparatus 10 in accordance with the present example embodiment includes a first measurement line 15 that measures dynamic characteristics of the power devices and a second measurement line 16 that measures static characteristics of the power devices as described below.

As depicted in FIG. 1, the first measurement line 15 includes, for example, multiple conducting pins 15A arranged at preset intervals along an outer periphery of the lower surface of the probe card 14 in a circumferential direction thereof, and a cable 15B electrically connected to the multiple conducting pins 15A via a conductive member (not illustrated). The other end of the cable 15B is electrically connected to a tester 17. The conductive member configured to connect the conducting pins 15A and the cable 15B is provided on the lower surface of the probe card 14. The multiple conducting pins 15A are configured to be electrically attached and detached to/from the first conductive film electrode member 13A by moving the chuck top 12A up and down through an elevation driving device (not illustrated) embedded in the mounting table 12. Like, for example, pogo pins, the conducting pins 15A have elasticity and are configured to be elastically brought into contact with the first conductive film electrode member 13A. These conducting pins 15A may be desirably formed on multiple places at preset intervals along the outer periphery of the probe card 14, but may be formed on a single place.

When dynamic characteristics of the power devices are measured, the chuck top 12A of the mounting table 12 is raised by a certain amount. Thus, the first conductive film electrode member 13A (collector electrode) of the chuck top 12A is brought into electrical contact with the conducting pins 15A, and the tester 17 is electrically connected to the conductive film electrode (collector electrode) 13 of the chuck top 12A via the first measurement line 15. Further, the multiple probes 14A are brought into electrical contact with the gate electrode and the emitter electrode of each of the power devices formed on the wafer W mounted on the chuck top 12A. In this state, if a preset voltage is applied from the tester 17 to the gate electrode of the power device, a high current flows from the tester 17 to the first conductive film electrode member 13A of the chuck top 12A via the first measurement line 15, and this current flows from the collector electrode of the power device to the tester 17 through the emitter electrode. Since the first measurement line 15 has a short length, inductance is low. Therefore, it is possible to surely measure dynamic characteristics of the power devices without being affected by the inductance.

Further, the second measurement line (cable) 16 electrically connects the tester 17 to the second conductive film electrode member 13B and is configured to measure static characteristics of the power devices. Desirably, this measurement line 16 may have a short length to suppress affection of electromagnetic interference from its surroundings as much as possible, and in the present example embodiment, it is set to be about 2000 mm. This measurement line 16 includes a switch device 18 configured to open and close an electric path between the second conductive film electrode member 13B and the tester 17. This switch device 18 separates the second measurement line 16 from the chuck top 12A by opening a switch to suppress affection of the inductance of the second measurement line 16 when dynamic characteristics of the power devices are measured as described above.

Examples of the switch device 18 may include, for example, a relay switch device, a solenoid switch device, and a cylinder switch device. Depending on a kind of the switch device 18, a connection example between the second measurement line 16 and the second conductive film electrode member 13B varies as depicted in FIG. 2 and FIG. 3. FIG. 2 illustrates a probe apparatus having a relay switch device, and FIG. 3 illustrates a probe apparatus having a solenoid switch device. Therefore, hereinafter, a relay switch device and a solenoid switch device as examples will be explained.

Figure 2:
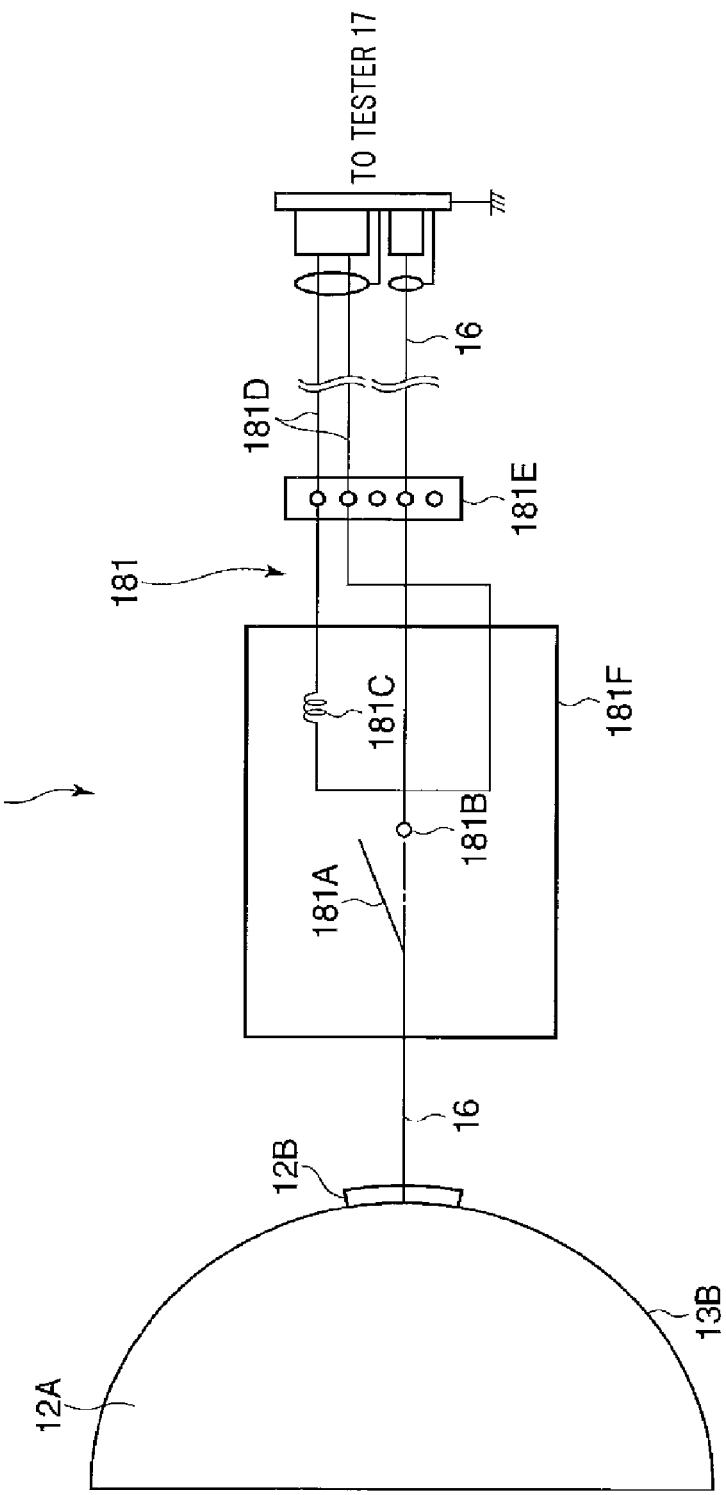
FIG. 2 is a configuration view showing main parts of the probe apparatus depicted in FIG. 1.

FIG. 2 is a configuration view showing main parts of the probe apparatus depicted in FIG. 1.

As depicted in FIG. 2, a relay switch device 181 as the switch device 18 includes a switch 181A provided at the second measurement line 16, a contact point 181B of the switch 181A, a coil 181C configured to magnetize the contact point 181B, a wiring 181D configured to connect the coil 181C to a power supply (not illustrated), and a controller 181E configured to control the coil 181C. If the contact point 181B is magnetized via the coil 181C, the switch 181A is brought into electrical contact with the contact point 181B as indicated by a dashed dotted line, and the collector electrode of the power device on the chuck top 12A is electrically connected to the tester 17 via the second measurement line 16. The switch 181A, the contact point 181B, and the coil 181C are all accommodated in a high-insulation block 181F.

One end of the second measurement line 16 including the relay switch device 181 is electrically connected to the second conductive film electrode member 13B formed on the entire surface of the circumferential surface of the chuck top 12A and the other end thereof is electrically connected to the tester 17 as depicted in FIG. 2. In order to ensure the electrical connection between the second measurement line 16 and the second conductive film electrode member 13B, at a connecting portion between the second measurement line 16 and the second conductive film electrode member 13B, a conductive plate 12B is provided in a certain range. The second measurement line 16 is firmly fixed to this conductive plate 12B by a fixing member such as a screw or the like. The relay switch device 181 is provided at the second measurement line 16 to be close to the mounting table 12 as depicted in FIG. 2. The relay switch device 181 is in an opened state when dynamic characteristics of the power devices are measured, and it is in a closed state when static characteristics of the power devices are measured.

Figure 3:
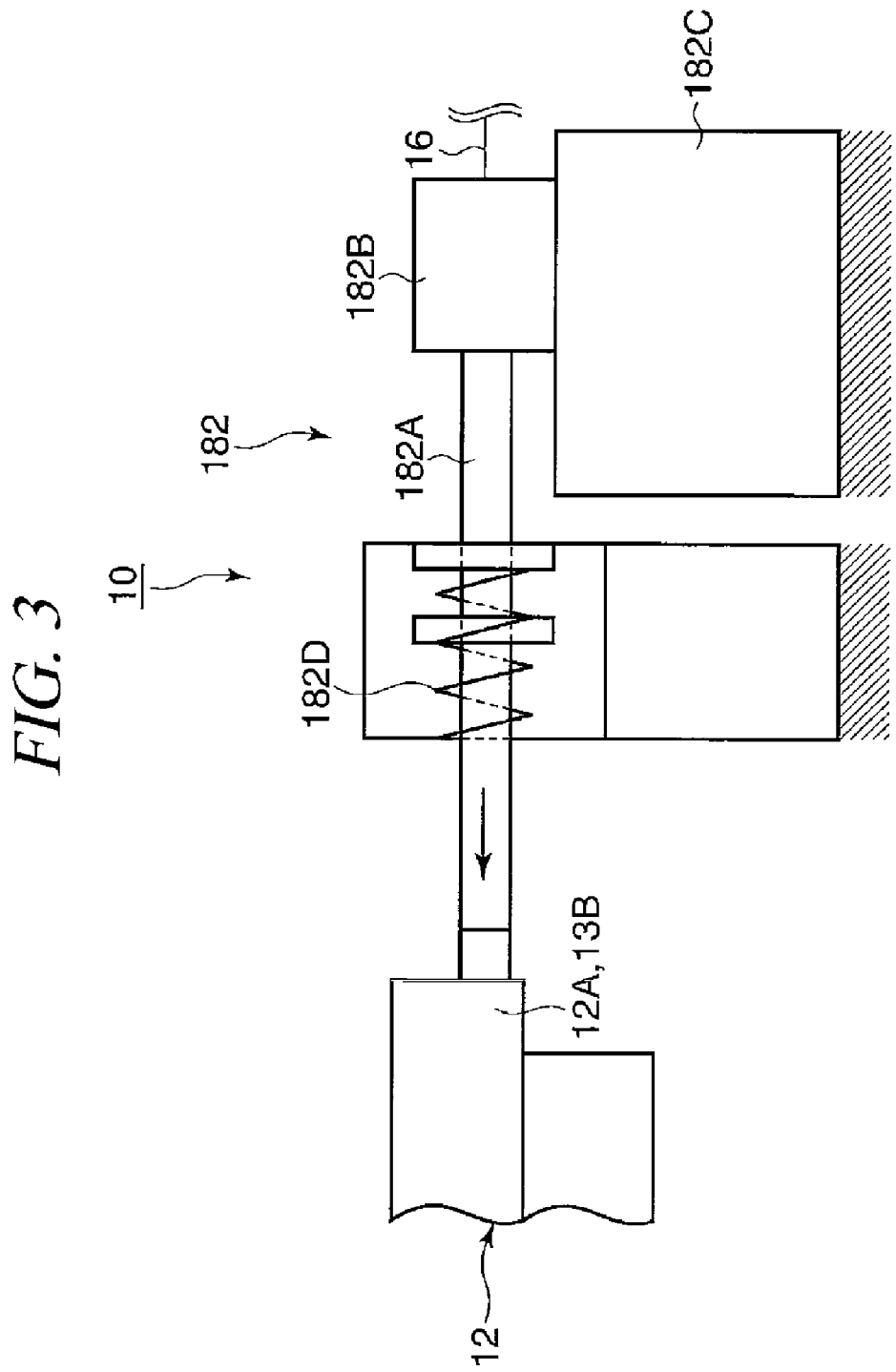
FIG. 3 is a configuration view showing main parts of a probe apparatus in accordance with another example embodiment.
Figure 4:
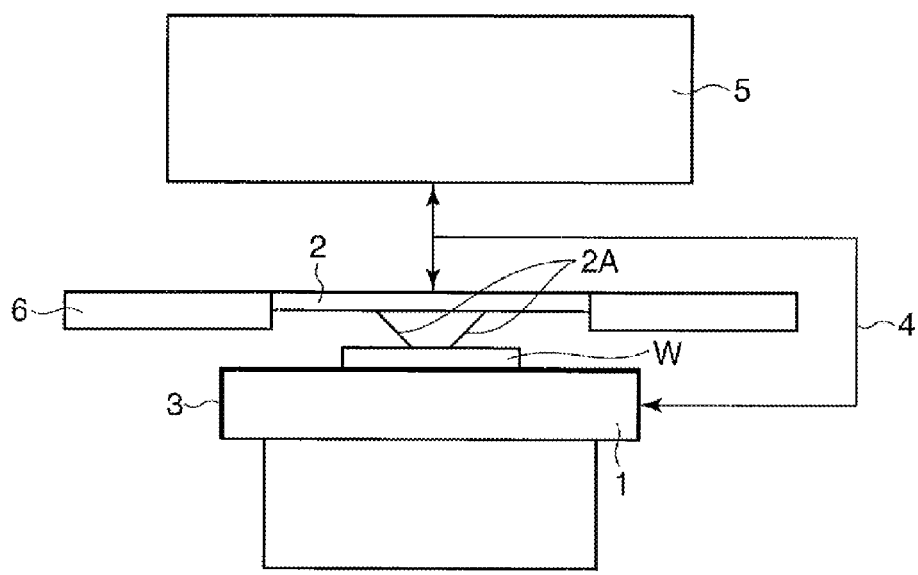
FIG. 4 is a conceptual diagram showing an example of a conventional probe apparatus.

As depicted in FIG. 3, a solenoid switch device 182 as the switch device 18 includes a contactor 182A electrically connected to an end portion of the second measurement line 16, a solenoid 182B configured to straightly move the contactor 182A, a driving control unit 182C configured to magnetize the solenoid 182B, and a coil spring 182D configured to return the contactor 182A to its original position when the magnetization of the solenoid 182B is removed. Under the control of the driving control unit 182C, the contactor 182A is straightly moved back and forth in cooperation with the solenoid 182B and the coil spring 182D, and a front end of the contactor 182A is configured to be attached and detached to/from the second conductive film electrode member 13B of the chuck top 12A. When static characteristics of the power devices are measured, the contactor 182A is in contact with the second conductive film electrode member 13B, and the tester 17 is electrically connected to the second conductive film electrode member 13B. Meanwhile, when dynamic characteristics of the power devices are measured, the contactor 182A is separated from the second conductive film electrode member 13B to separate the second measurement line 16 from the conductive film electrode 13 and disconnect the second conductive film electrode member 13B from the tester 17. Although not illustrated, the solenoid 182B includes a plunger, a receiving portion configured to receive the plunger, and a coil configured to move the plunger back and forth. The contactor 182A is provided along an axis center of the plunger and is moved back and forth via the plunger.

Hereinafter, an operation of the probe apparatus 10 in accordance with the present example embodiment will be explained. When electrical characteristics of the power devices are measured, for example, after static characteristics are measured, dynamic characteristics are measured. In order to do so, the switch device 18 is driven in advance to close an electric path of the second measurement line 16 and electrically connect the second conductive film electrode member 13B of the chuck top 12A to the tester 17. In this state, the wafer W on which the multiple power devices are formed is unloaded from the loader chamber and then mounted on the chuck top 12A of the mounting table 12 within the prober chamber 11. Thereafter, the wafer W is held onto the chuck top 12A via the vacuum-attraction unit. Then, the gate electrode and the emitter electrode of the wafer W on the mounting table 12 are aligned with the multiple probes 14A of the probe card 14 via an alignment device.

Thereafter, by moving the mounting table 12 to be raised from right below a power device to be measured first, a gate electrode and an emitter electrode of the power device are brought into electrical contact with the multiple probes 14A. In this state, if a voltage is applied to the gate electrode of the power device from the tester 17 via the probe 14A, a high current flows from the tester 17 to the second conductive film electrode member 13B of the chuck top 12A, i.e. the conductive film electrode 13, via the second measurement line 16. This current flows from the collector electrode of the power device to the emitter electrode. In this case, static characteristics, such as resistance, of the power device are measured via another probe 14A, and the tester 17 obtains the static characteristics such as resistance based on a result of the measurement. After the static characteristics are measured from the first power device, the mounting table 12 is moved, and then, static characteristics of a next power device are sequentially measured.

After the static characteristics of the power devices are measured, dynamic characteristics are measured. That is, the switch device 18 is driven to open the electric path of the second measurement line 16 and disconnect the tester 17 from the chuck top 12A. In this state, a power device to be measured first is moved to right below the probe card 14. Then, when the chuck top 12A is raised, a gate electrode and an emitter electrode of the power device are brought into electrical contact with the multiple probes 14A of the probe card 14, and the first conductive film electrode member 13A of the chuck top 12A is brought into electrical contact with the multiple conducting pins 15A protruding downwardly from the probe card 14. Thus, the gate electrode and the emitter electrode of the power device are connected to the tester 17 via the probes 14A, and the collector electrode of the power device is electrically connected to the tester 17 via the first conductive film electrode member 13A of the chuck top 12A and the multiple conducting pins 15A (first measurement line 15).

Then, when a voltage is applied from the tester 17 to the gate electrode of the power device via the probe 14A, a high current flows from the tester 17 to the conductive film electrode 13 of the chuck top 12A via the first measurement line 15 (cable 15B) and the conducting pins 15A. Then, the high current flows to the collector electrode of the power device and then introduced from the emitter electrode to the tester 17. As a result, the tester 17 can measure dynamic characteristics of the power device. In this case, since the second measurement line 16 is disconnected from the chuck top 12A, it is possible to suppress affection of inductance caused by the second measurement line 16.

As explained above, in accordance with the present example embodiment, both of static characteristics and dynamic characteristics of the power devices can be measured with the single probe apparatus 10, and when dynamic characteristics are measured, the dynamic characteristics of the power devices can be surely measured at a wafer level without being affected by the second measurement line 16 that measures static characteristics.

The above-described example embodiment is not provided for limitation, and each component can be modified and changed in design as necessary. The switch device provided at the second measurement line 16 is not limited to the description of the present example embodiment, and any one including a switch device can be appropriately employed.

EXPLANATION OF REFERENCE NUMERALS

10: Probe apparatus
12: Mounting table
12A: Chuck top
14: Probe card
14A: Probe
15: First measurement line
15A: Conducting pins (Conductors)
16: Second measurement line
17: Tester
18: Switch device
181: Relay switch device
182: Solenoid switch device
W: Wafer

We claim:

1. A probe apparatus for measuring static characteristics or dynamic characteristics of power devices by electrically connecting multiple probes with multiple electrodes of each of the power devices of a target object, the probe apparatus comprising:
    a movable mounting table that mounts the target object on which multiple power devices are formed;
    a probe card that is provided above the mounting table and has the multiple probes;
    a conductive film electrode formed on at least a mounting surface of the mounting table;
    a first measurement line that electrically connects the conductive film electrode to a tester via the probe card and measures the dynamic characteristics of the power devices; and
    a second measurement line that electrically connects the conductive film electrode to the tester and measures the static characteristics of the power devices,
    wherein the conductive film electrode includes a first conductive film electrode member formed on the mounting surface of the mounting table and a second conductive film electrode member formed on a side surface of the mounting table,
    the second measurement line electrically connects the second conductive film electrode member to the tester, and
    the second measurement line includes a switch device configured to open and close the second measurement line between the second conductive film electrode member and the tester.

2. The probe apparatus of claim 1,
wherein the switch device includes a relay switch device.

3. The probe apparatus of claim 1,
wherein the switch device includes a solenoid device and a contactor configured to be electrically attached and detached to and from the second conductive film electrode member via the solenoid device.

4. The probe apparatus of claim 1,
wherein the first measurement line includes a conductor provided between the conductive film electrode and the probe card.

* * * * *